United States Patent
Pilgrim et al.

(10) Patent No.: US 6,683,895 B2
(45) Date of Patent: Jan. 27, 2004

(54) WAVELENGTH AGILE EXTERNAL CAVITY DIODE LASER

(75) Inventors: Jeffrey S. Pilgrim, Santa Fe, NM (US); Daniel B. Oh, Azusa, CA (US)

(73) Assignee: Southwest Sciences Incorporated, Santa Fe, NM (US)

(*) Notice: Subject to any disclaimer, the term of this patent is extended or adjusted under 35 U.S.C. 154(b) by 7 days.

(21) Appl. No.: 09/912,817

(22) Filed: Jul. 24, 2001

(65) Prior Publication Data

US 2002/0015427 A1 Feb. 7, 2002

Related U.S. Application Data

(60) Provisional application No. 60/220,708, filed on Jul. 26, 2000.

(51) Int. Cl.[7] .............................. H01S 3/10; H01S 3/04; H01S 5/00; H01S 3/08
(52) U.S. Cl. .............................. 372/20; 372/23; 372/44; 372/34; 372/99; 372/102
(58) Field of Search ........................ 372/20, 23, 29.015, 372/34, 45, 50, 46, 102, 44, 99

(56) References Cited

U.S. PATENT DOCUMENTS

| | | |
|---|---|---|
| 5,319,668 A | 6/1994 | Lueke |
| 5,428,635 A | 6/1995 | Zhiglinsky et al. |
| 5,771,252 A | 6/1998 | Lang et al. |
| 5,995,521 A | 11/1999 | Moore et al. |
| 6,040,914 A | 3/2000 | Bortz et al. |
| 6,118,803 A * | 9/2000 | Sanders et al. ............. 372/50 |
| 6,188,705 B1 * | 2/2001 | Krainak et al. ............. 372/32 |
| 2002/0036206 A1 * | 3/2002 | Jerman et al. ............. 372/20 |
| 2002/0154662 A1 | 10/2002 | Turpin et al. |

OTHER PUBLICATIONS

Harvey, K.C., et al., "External–Cavity Diode Laser Using a Grazing–Incidence Diffraction Grating," *Optics Letters*, vol. 16, No. 12 pp 910–912 (Jun. 15, 1991).
Littman, M.G., et al., "Spectrally Narrow Pulsed Dye Laser Without Beam Expander," *Applied Optics*, vol. 17, No. 14 pp 2224–2227 (Jul. 15, 1978).
Oh, D.B., et al., "Wavelength–Modulation Detection of Acetylene with a Near–Infrared External–Cavity Diode Laser," *Applied Optics*, vol. 34, No. 30, pp 7002–7005 (Oct. 20, 1995).

* cited by examiner

*Primary Examiner*—Paul Ip
*Assistant Examiner*—Armando Rodriguez
(74) *Attorney, Agent, or Firm*—Jeffrey D. Myers

(57) ABSTRACT

An external cavity diode laser and method of generating laser light comprising: generating light from a Fabry-Perot diode laser source; collimating light from the source with an intracavity optical element; reflecting light via a feedback mirror; and employing a diffraction grating to receive light from the optical element, diffract received light to the mirror in a non-zero order, receive reflected light from the mirror, and direct reflected light back towards the optical element and Fabry-Perot diode laser to complete an external cavity, the diffraction grating additionally directing a portion of the received light from the optical element toward a target.

24 Claims, 6 Drawing Sheets

WAVELENGTH AGILE EXTERNAL CAVITY DIODE LASER

CROSS-REFERENCE TO RELATED APPLICATIONS

This application claims the benefit of the filing of U.S. Provisional Patent Application Ser. No. 60/220,708, entitled "Wavelength Agile External Cavity Diode Laser", filed on Jul. 26, 2000, and the specification thereof is incorporated herein by reference.

GOVERNMENT RIGHTS

The U.S. Government has a paid-up license in this invention and the right in limited circumstances to require the patent owner to license others on reasonable terms as provided for by the terms of Contract No. NAS3-00054 and Contract No. NAS3-01007 awarded by the U.S. National Aeronautics and Space Administration.

BACKGROUND OF THE INVENTION

1. Field of the Invention (Technical Field)

The present invention relates to high-sensitivity detection of contaminants in gases by optical techniques and to telecommunications applications by optical techniques generally implemented with wavelength tunable lasers.

2. Background Art

Diode lasers have become increasingly important for optical detection of gases (trace gas detection). Typically, high sensitivity detection is achieved with diode lasers by rapidly modulating the laser wavelength across an absorption feature of the target species. By rapidly modulating the laser wavelength, laser intensity noise is dramatically reduced. However, a drawback of using diode lasers for gas sensing applications is that they operate over a very limited wavelength range. Typically, only one species can be detected with a given laser. The output wavelength range of a diode laser can be expanded using an external cavity configuration. With such a configuration, multiple species detection is possible. However, external cavity diode lasers (ECDL) cannot be wavelength modulated at more than a few kHz. This inability to provide rapid wavelength modulation limits achievable gas detection sensitivity.

The present invention uses an external cavity design that overcomes the low modulation frequency limitations of present external cavity lasers. Furthermore, in contrast to present external cavity laser designs, the design described herein is simple, inexpensive to implement and rugged. The present invention combines the stability and tunability of an ECDL with the wavelength agility of a diode laser.

A successful commercial ECDL is produced by New Focus, Inc., and a similar device is offered by Newport Corporation. These ECDLs are based on the Littman-Metcalf grazing incidence design. M. G. Littman, et al., Appl. Opt. 17, 2224 (1978). Both instruments employ mechanical movement of a cavity feedback mirror. The maximum wavelength modulation frequency is limited to 2 kHz by the need to move the mirror. Such low modulation frequencies are less effective at reducing the laser "excess" noise that is often the limiting noise source in wavelength modulation absorption measurements of trace gas concentrations. Because of the high dispersion employed in the Littman-Metcalf ECDL design, it is not possible to modulate the laser wavelength by modulating the diode laser injection current or temperature.

The New Focus and Newport ECDLs are designed to be general laboratory spectroscopic optical sources and they are well suited to the application. The lasers exhibit extended wavelength tuning ranges without mode hops (where a mode hop is a sudden, discontinuous change in laser output wavelength) and only minor variation in laser output power. They are capable of 2 kHz wavelength modulation at any wavelength within their nominal tuning ranges. Thus, the lasers are designed for obtaining high-resolution spectra of gaseous molecules over a broad wavelength range. This capacity is necessary for obtaining spectra of molecules for the first time or performing survey scans. Unfortunately, operation as an all-purpose tunable spectroscopic source prevents these commercial instruments from achieving the high-sensitivity required for trace gas detection. Furthermore, their cost is prohibitive in most sensing applications.

The present invention retains the broad wavelength tuning of the Littman-Metcalf design and can achieve the high frequency wavelength modulations that are useful for trace gas detection. The differences between the present invention and previous ECDL designs are substantial and will become apparent through further description of the design. The wavelength modulation frequency of the present invention is limited only by the injection current modulation response of the diode laser used as the gain element. Thus, wavelength modulation frequencies in the GHz regime are possible. In addition, the present invention retains the broad wavelength tuning range of commercial instruments. The present invention may not work as well for laboratory survey spectroscopy because it does not tune without mode hopping and the output amplitude is not constant. Nevertheless, the present invention is superior for trace gas detection and the reduced complexity with increased capability results in an ECDL that is much lower cost than present commercial instruments.

Commercial ECDL manufacturers have expended significant effort to provide continuous single mode tuning in a single mechanical movement. To meet this requirement the cavity length must change concomitantly with the angular selection of the cavity feedback mirror. This capability is the basis of New Focus' U.S. Pat. Nos. 5,319,668 and 5,995,521. The present invention obviates the requirement for continuous single mode tuning by specifically allowing longitudinal mode hops that are controlled by the diode laser gain element injection current and temperature. Mode hops work to advantage because they are controlled so as to occur predictably and reproducibly. In addition, the present invention mode hops wavelengths successively in a single direction at a time as determined by the laser injection current or diode laser temperature.

A significant portion of optical sources used in telecommunications are continuous wave (cw) single frequency diode lasers. Direct amplitude modulation of these optical sources with injection current is not often utilized in high frequency and long haul applications. Instead, the information encoding on these optical sources is typically added downstream of the laser using electro-optic modulators. The present invention improves upon single frequency continuous wave ECDLs, making them suitable as optical sources for telecommunications.

Typical diode lasers used in telecommunications, particularly those used for dense wavelength division multiplexing (DWDM) applications, are based on distributed feedback (DFB) structures. The DFB structure requires post-growth processing and results in devices an order-of-magnitude more expensive than Fabry-Perot based structures. Although DFB lasers have some temperature and current tuning capability, tuning ranges are limited relative to ECDL designs. An individual DFB laser is suitable for only one DWDM channel. The present invention combines the less expensive Fabry-Perot laser structure with other inexpensive optical components to allow operation at any one of many DWDM channels. The overall cost of the ECDL is about the same as a DFB laser that is limited to operation at only one DWDM channel.

The ECDL of the present invention, then, is well suited as a back-up device for DWDM transmitters. If a primary DFB-driven channel fails, the ECDL can take over until the channel can be repaired. Because the ECDL can operate on many DWDM channels, it can act as a temporary replacement for many DFB lasers. Alternatively, with the present advancement towards dynamically reconfigurable DWDM transmitters, a suite of the ECDLs of the present invention would be used as primary optical sources. Each ECDL could be configured to operate on any one of many DWDM channels so that channels could be added or dropped based on the real-time bandwidth requirements.

Other telecommunications applications utilizing tunable optical sources of the invention also improve on the state of the art. Examples include test and measurement of telecommunications components in the field and during research and development.

SUMMARY OF THE INVENTION
(DISCLOSURE OF THE INVENTION)

The present invention is of an external cavity diode laser and method of generating laser light, comprising: generating light from a Fabry-Perot diode laser source; collimating light from the source with an intracavity optical element; reflecting light via a feedback mirror; and employing a diffraction grating to receive light from the optical element, diffract received light to the mirror in a non-zero order, receive reflected light from the mirror, and direct reflected light back towards the optical element and Fabry-Perot diode laser to complete an external cavity, the diffraction grating additionally directing a portion of the received light from the optical element toward a target. In the preferred embodiment, the Fabry-Perot diode laser lacks an anti-reflection coating or has an anti-reflection coating that does not interfere with residual diode laser Fabry-Perot modes providing sufficient differential gain when tuned by injection current or temperature to allow single frequency operation and single longitudinal mode-hopping within a pass band of the grating. A multiple pass optical configuration can be employed to provide a sufficiently narrow longitudinal mode spacing. The mirror preferably reflects a first order diffraction from the grating, provides wavelength selectivity to the light directed toward the target, and provides a sufficiently low dispersion to allow wavelength tuning by longitudinal mode hopping within a grating pass band through interaction of the grating pass band with diode laser Fabry-Perot modes where the interaction simultaneously ensures operation over successive single longitudinal modes. The wavelength of the light directed toward the target may additionally be tuned by varying a diode gain element injection current of the diode laser source or by varying the temperature of the diode laser source. Wavelength modulation of the light directed toward the target may be accomplished by injection current modulation or by diode laser temperature modulation. In an optical system, the target may be an optical fiber light injection apparatus.

Objects, advantages and novel features, and further scope of applicability of the present invention will be set forth in part in the detailed description to follow, taken in conjunction with the accompanying drawings, and in part will become apparent to those skilled in the art upon examination of the following, or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated into and form a part of the specification, illustrate one or more embodiments of the present invention and, together with the description, serve to explain the principles of the invention. The drawings are only for the purpose of illustrating one or more preferred embodiments of the invention and are not to be construed as limiting the invention. In the drawings.

DESCRIPTION OF THE PREFERRED EMBODIMENTS (BEST MODES FOR CARRYING OUT THE INVENTION)

The ECDL of the present invention is based on the Littman-Metcalf design as modified by Harvey and Myatt. K. C. Harvey, et al., Opt. Lett. 16, 910 (1991). To recover the basic features that make a diode laser appealing for trace gas detection, the invention implements the basic Fabry-Perot laser as the gain element in a low dispersion external cavity diode laser. Operation as an ECDL allows a wavelength selective optical element to be included that ensures operation at any desired wavelength within the device gain bandwidth. In the Littman-Metcalf design, the zeroeth order output of the diffraction grating is used as the laser output. The cavity feedback mirror is one end of the resonator; it reflects the first order diffraction from the grating. The other end of the resonator is the outer facet surface of the Fabry-Perot diode element. Wavelength selectivity is achieved by setting the angle of the diffracted return beam with the cavity feed back mirror.

Figure 1:
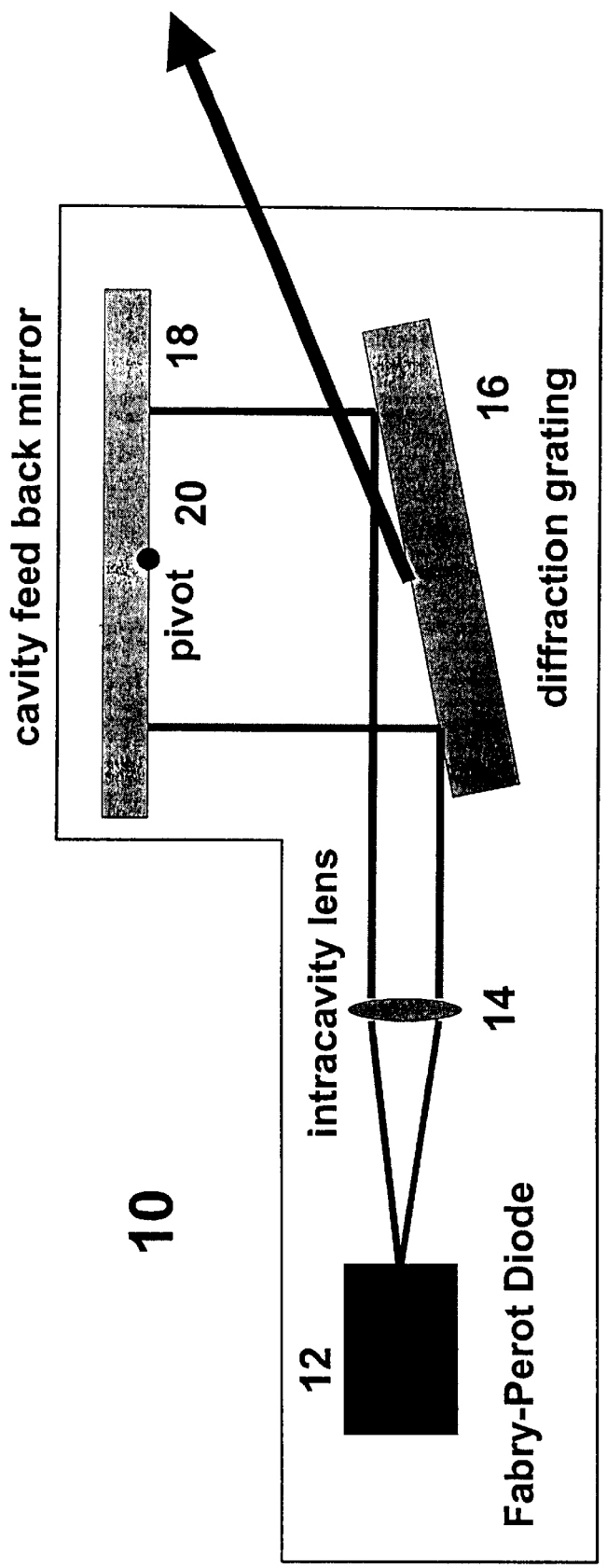
FIG. 1 is a schematic drawing of the components of the present ECDL invention 10. The schematic layout is that of a generalized Littman-Metcalf design. However, an off-the-shelf Fabry-Perot diode laser 12 is used as the gain element with no anti-reflection coating. The laser diode output is collimated with a lens 14 and directed to a low dispersion diffraction grating 16 where wavelength selection occurs. The diffracted beam is reflected from the cavity feedback mirror 18 with pivot 20 to complete the laser resonator.

FIG. 1 is a schematic of the low-dispersion ECDL of the invention. The design is advantageous for telecommunication applications because the position and direction of the zeroeth order of the grating do not change with ECDL output wavelength. Thus, the ECDL can be easily fiber coupled through the zeroeth order output for incorporation into typical optical networks. Injection of the ECDL output into both single mode and multiple mode optical fiber, through various light insertion means known in the art, is advantageous for implementation of the present invention in optical telecommunications networks.

Several features of the present invention distinguish it from the basic Littman-Metcalf design. These features provide functionality that are essential for high-sensitivity trace gas detection and offer competitive advantages in telecommunication applications. A description of these features follows.

First, the invention utilizes a diffraction grating with low dispersion. In contrast to commercial implementations of the Littman-Metcalf resonator, the dispersion is chosen to be as low as practical. Dispersion measures the laser gain contrast imposed by the dispersive element over a given wavelength range. The higher the dispersion of the ECDL, the less likely the laser is to hop longitudinal modes during tuning with laser injection current or temperature. While mode hop-free behavior is desirable for a general spectroscopic laser source, it is not necessarily consistent with high sensitivity trace gas detection. The present invention uses a laser resonator with over an order-of-magnitude less dispersion than present commercial ECDLs. This quantification is not meant to be limiting and the optimum dispersion for the invention will depend on the particular laser diode used as the gain medium and the particular application. The most important feature of the low dispersion design is that, under specific operating conditions, the dispersion is sufficient to allow only one external cavity longitudinal mode to oscillate. Under other operating conditions, a different single longitudinal cavity mode may oscillate. Wavelength tuning is accomplished by a series of successive mode hops from one longitudinal mode to the next adjacent longitudinal mode. Coarse wavelength tuning is accomplished by rotating the feedback mirror.

Second, the Fabry-Perot diode used as the ECDL gain medium is not anti-reflection (AR) coated. This makes the laser used as the gain element less expensive and available in a wider range of wavelengths. Obtaining a high-quality AR coating is the most serious impediment to using new diode laser materials in traditional Littman-Metcalf ECDLs. Because it is not AR coated, the Fabry-Perot modes of the gain element in the present design are preserved. More importantly, these Fabry-Perot modes can be wavelength tuned using the laser injection current and device temperature. The shifting of the residual Fabry-Perot modes within the pass band of the low dispersion diffraction grating causes the ECDL to tune wavelength. Complete spectral coverage within the diode gain element's nominal gain curve is achieved. The Fabry-Perot modes, longitudinal modes of the external cavity, and the grating force the ECDL to operate on a single external cavity mode within the broad gain curve of the diode laser. Changing the diode laser injection current causes operation on consecutive external cavity modes within the grating pass band. The ECDL tunes in small, discrete steps, a manner which is quite different from commercial ECDLs. For gas sensing applications, each step is preferably smaller than the molecular absorption feature. In the case of telecommunications applications the length of the external cavity is selected such that the ECDL mode spacing provides the desired set wavelength accuracy. Without the external cavity, the Fabry-Perot diode laser would make a large wavelength change to another Fabry-Perot mode of the diode laser. The invention is not meant to be limited to Fabry-Perot diode lasers that have exactly zero AR coating. Some coatings will not have a deleterious effect on the invention's operation as long as the residual diode laser Fabry-Perot modes provide sufficient differential gain when tuned by injection current or temperature to allow single longitudinal mode-hopping within the diffraction grating pass band.

Third, the ECDL cavity length is chosen to provide the wavelength precision required by the application. The wavelength spacing between successive external cavity longitudinal modes is determined by the length of the external cavity. Because the present design relies on wavelength tuning by hopping from one mode to the next adjacent mode, the spacing should be small enough so that there are many longitudinal modes within the bandwidth of the gaseous absorption feature under study. This requirement makes our cavity longer than conventional designs. For example, if the absorption feature has a bandwidth of 6 GHz and it is desired to have ten (10) longitudinal modes within that bandwidth, the ECDL cavity should be 25 cm long. Present commercial ECDLs have cavity lengths of a few cm. For telecommunication applications the longitudinal mode spacing determines how closely the ECDL can operate to any arbitrary wavelength. In the 25 cm long example above the ECDL will not operate more than 300 MHz from any wavelength in its tuning range. If the cavity were 50 cm long, the closest obtainable operating wavelength would be no further than 150 MHz from any arbitrarily chosen wavelength within the device operating range.

The invention allows the ECDL to be tuned by adjusting the cavity feedback mirror angle and by varying the diode gain element injection current. Thus, wavelength modulation frequencies may be many orders-of-magnitude higher than with present commercial designs. Because commercial designs employ piezo-electric driven mechanical movement of an optical element, they are limited to modulation frequencies below 2 kHz. Our invention has been wavelength modulated at over 50 kHz with wavelength excursions (modulation depths) optimal for trace gas detection. Frequencies in the GHz regime are possible. The higher wavelength modulation frequency has ramifications for use of our ECDL as a light source for trace gas sensing. Higher frequency operation results in less laser 'excess' noise and, thereby, increased sensitivity. Since absorption features can be quite weak and the gaseous species may be present at low concentration, the highest sensitivities are required.

Figure 2:
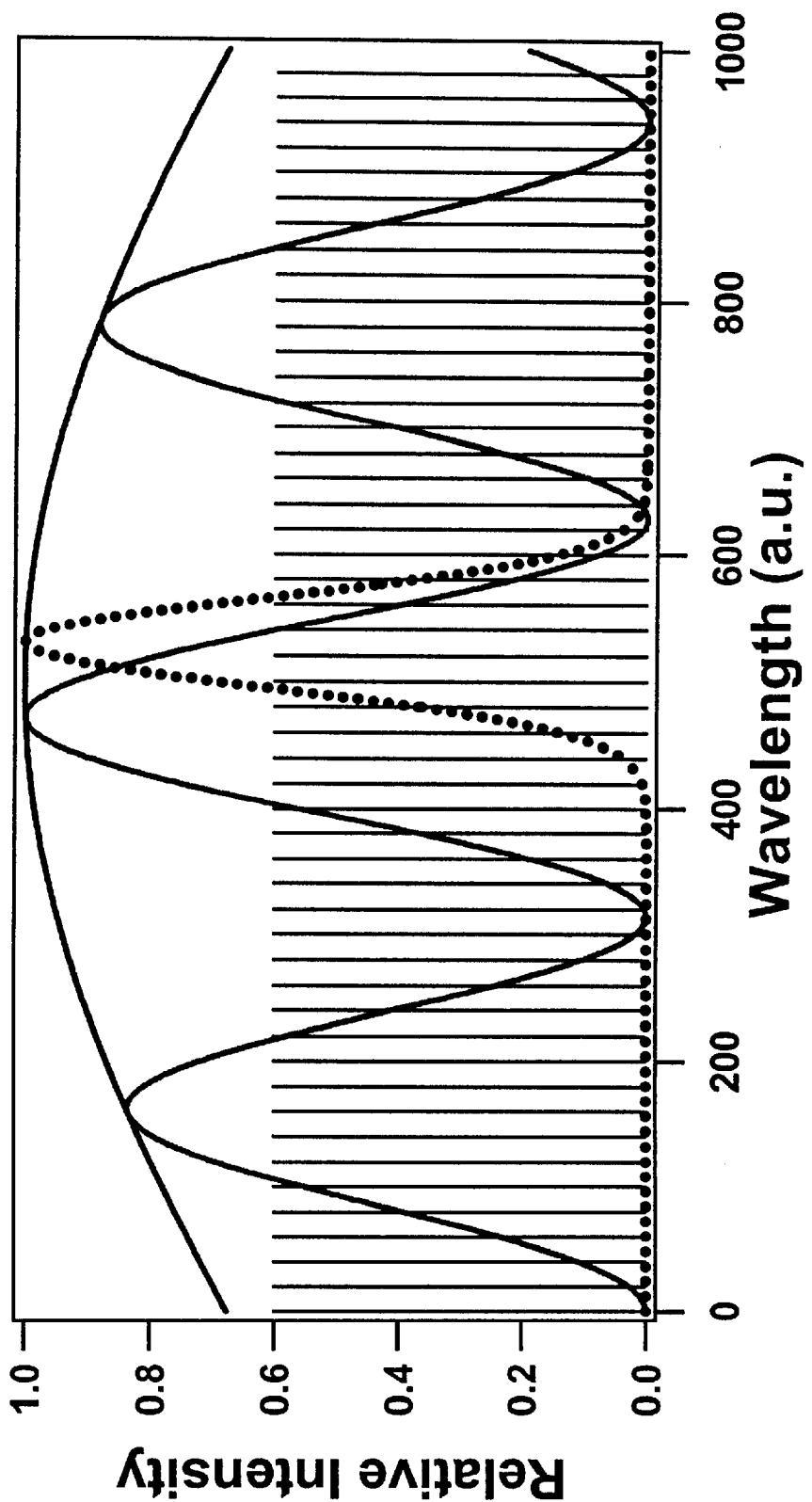
FIG. 2 is a drawing of the spectral narrowing effects of the several wavelength selective elements that allow wavelength tuning of the ECDL by variation of the diode laser injection current or temperature. The broad solid curve represents the intrinsic gain curve of the diode laser used as the ECDL gain element. The three narrower and evenly spaced curves represent the Fabry-Perot modes of the diode laser used as the ECDL gain element (note the finesse is not to scale). The series of vertical sticks are the longitudinal cavity modes imposed by the external cavity (note the finesse is not to scale). Finally, the broad dotted curve is the wavelength pass band as determined by the external cavity diffraction grating.

FIG. 2 shows the interplay between the various wavelength selective mechanisms of the invention. The general operating wavelength region for diode lasers is determined by the materials within the diode active region. The active layer materials, structure, and composition dictate the device band center wavelength and width of the gain curve. This is the coarsest wavelength-selecting element and is represented in the figure by the top-most gently curved line. Within this broad gain curve, Fabry-Perot diode lasers are further restricted to operating at wavelengths that are compatible with the optical length of the monolithic gain region. These Fabry-Perot modes of the diode laser are typically spaced by several wavenumbers. For telecommunications applications, it is recognized that it may be advantageous to have the Fabry-Perot modes spaced by the desired DWDM channel spacing or an integer multiple or fraction thereof. Furthermore, the Fabry-Perot mode spacing is determined by the length of the gain region and the refractive index of the gain region where the refractive index can be affected by laser injection current and temperature. Multiple Fabry-Perot modes may operate simultaneously and are tunable in wavelength by adjusting the diode laser temperature or injection current. The Fabry-Perot modes are represented in the figure by the curve with three maxima. Incorporation of a diffraction grating-based external cavity simultaneously adds two more wavelength selective constraints. A wavelength within a single diode laser Fabry-Perot mode is selected by the pass band of the diffraction grating. The band center of the grating pass band is set by the diffraction angle that experiences retro-reflection by the cavity feed back mirror. The grating pass band is represented in the figure by the dotted line. The external cavity additionally imposes longitudinal (and transverse) cavity modes that are determined by the length of the cavity. A longer cavity produces closer longitudinal cavity mode spacing. The vertical sticks in the figure represent the external cavity longitudinal modes. At a given cavity length, the ECDL may only operate at wavelengths corresponding to these cavity modes. The present invention relies on the movement of the grating-selected diode laser Fabry-Perot mode under the diffraction grating pass band to preferentially apply sufficient differential gain to a single selected ECDL cavity mode so that only that mode may oscillate. Further movement in either wavelength direction by the Fabry-Perot mode within the grating pass band will select the adjacent ECDL cavity mode corresponding to that direction. The movement of the Fabry-Perot mode within the grating pass band is controlled by injection current and diode laser temperature.

Figure 3:
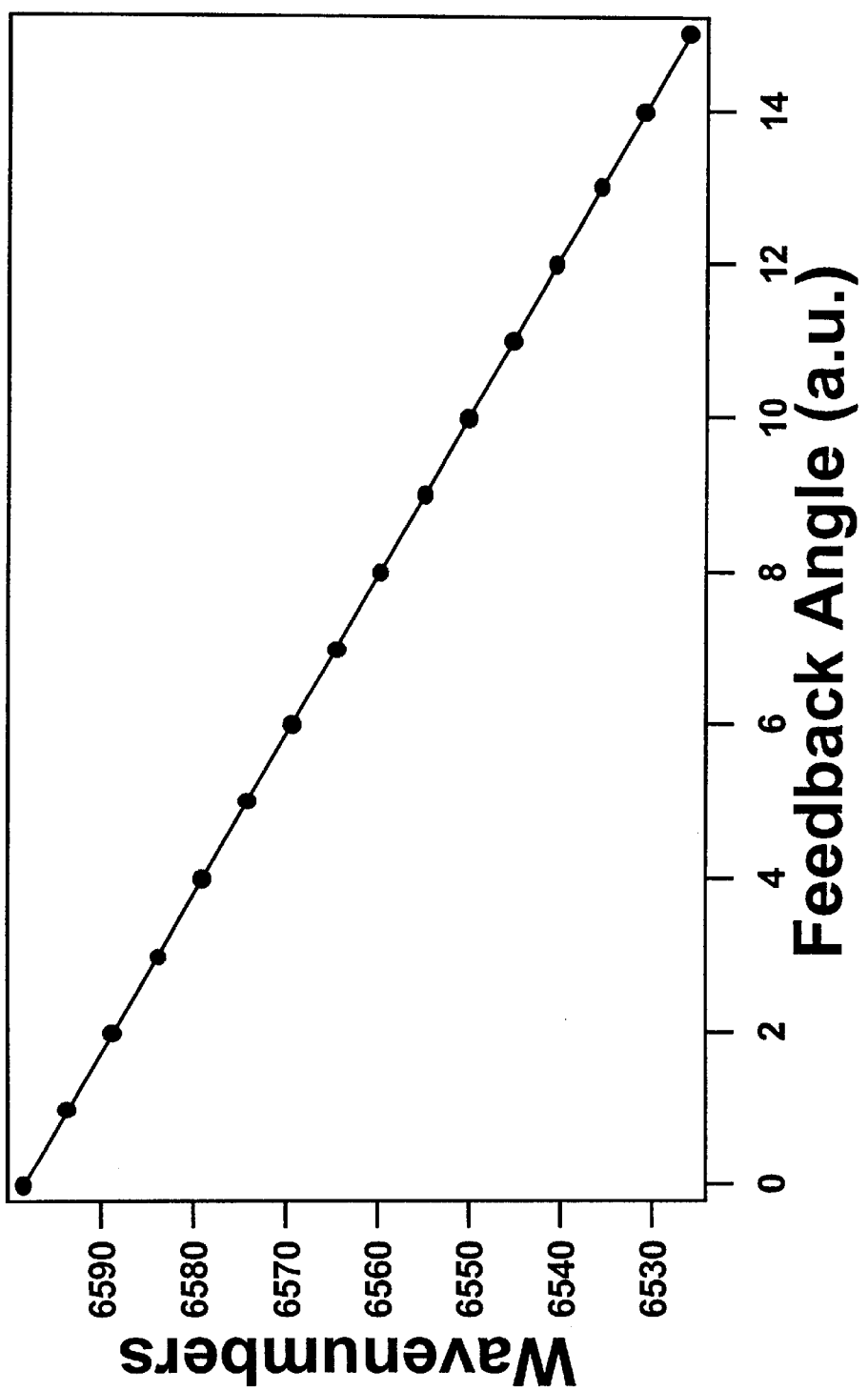
FIG. 3 is a graph showing the coarse tuning curve of the ECDL using the feedback mirror angle. Each data point shows a wavelength of single frequency operation within a particular laser diode Fabry-Perot mode.
Figure 4:
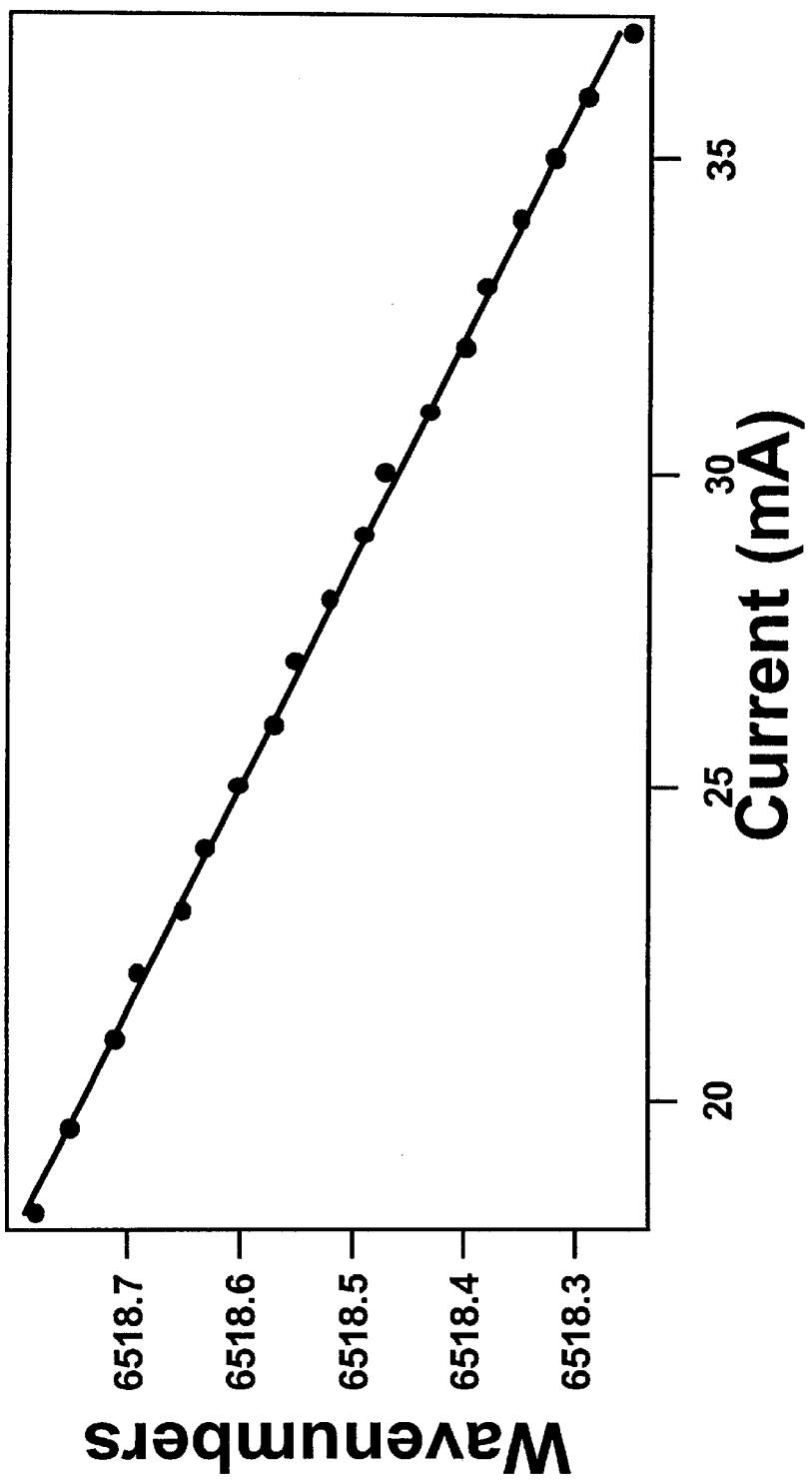
FIG. 4 is a graph showing the wavelength tuning of the ECDL invention with diode laser injection current. The discrete points on the curve represent operation on a supported ECDL longitudinal cavity mode. That is, the ECDL hops to successive points (wavelengths) on this curve.

The present invention demonstrates wavelength agility and broad wavelength operating ranges. The design allows wavelength tuning using the feedback mirror angle, the diode laser injection current, and diode laser temperature. A tuning curve using the feedback mirror angle is given in FIG. 3. Measurements of the ECDL laser output with a 0.25 m Chromex spectrometer show broad wavelength tuning by changing the diffraction feedback angle. Single frequency operation was determined by an interferometric wavemeter on successive grating-selected Fabry-Perot modes by tuning the feedback mirror. This coarse tuning curve is shown in the figure. At each data point the ECDL is operating single frequency but on a different laser diode Fabry-Perot mode. FIG. 4 shows the diode laser injection current tuning of the ECDL. The feedback mirror is not adjusted in the data of the figure. The change in injection current causes mode hops to successive ECDL cavity modes.

Figure 5:
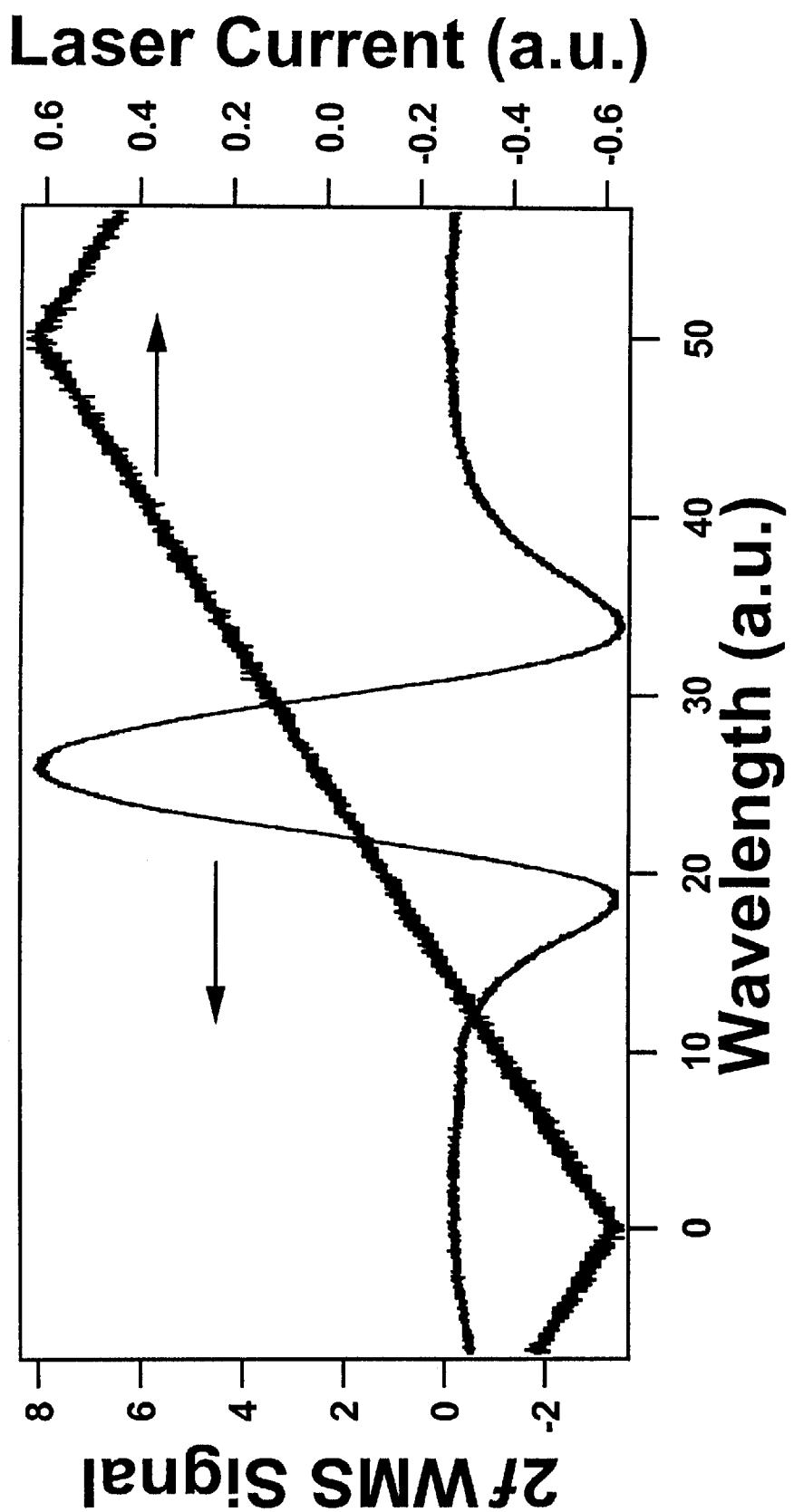
FIG. 5 is data obtained of the WMS absorption spectrum for HCN using the ECDL of the present invention. The laser was wavelength modulated at 5 kHz and the signal was processed by phase sensitive detection at 10 kHz. In addition to the laser diode current modulation a laser diode current ramp at 10 Hz sweeps the ECDL output wavelength across the absorption line.

The ECDL tuning properties differ from those of commercial ECDL designs because the ECDL of the present invention tunes in small, discrete steps. Each step, however, is substantially smaller than the absorption feature. This tuning mode is suitable for wavelength modulation methods. In fact, it is often preferred to use discrete modulation steps in wavelength modulation spectroscopy (WMS) sensing applications. FIG. 5 shows an experimentally obtained WMS spectrum using the present ECDL invention with 5 kHz modulation frequency, phase sensitive detection at 10 kHz, and a 10 Hz wavelength scan over the $H^{12}C^{14}N$ absorption feature at 6474.41 $cm^{-1}$.

Because the present ECDL design does not utilize mechanically modulated optical components, piezoelectric translators (PZT) and the associated drive electronics are not required. The present invention only requires the standard electronics drivers for the diode laser injection current and temperature. However, it may be convenient to use PZT driven opto-mechanical devices for coarse wavelength selection using the feed back mirror adjustment. This feature is useful for remote control of the ECDL operating wavelength in fielded telecommunication applications.

Figure 6:
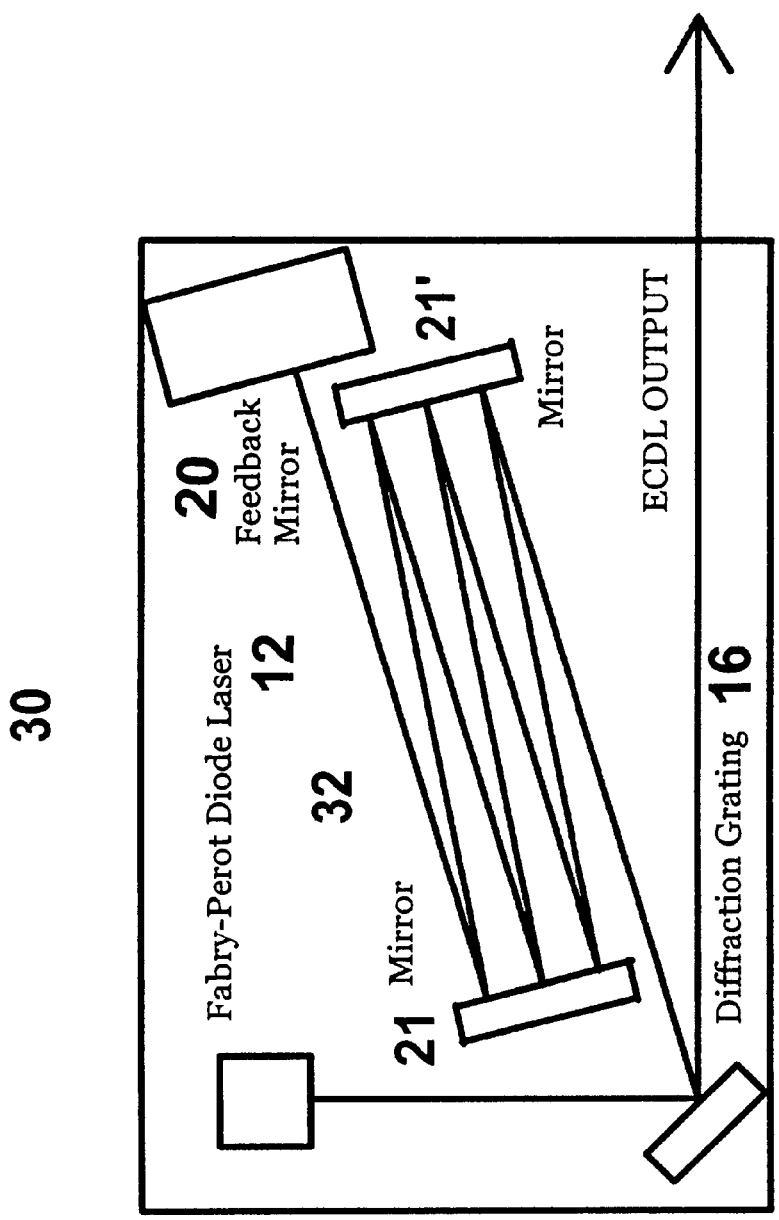
FIG. 6 shows a modified laser cavity design 30 that incorporates an intracavity multiple pass cell 32 in order to meet the long cavity length requirement in a physically compact package.

Rather than making a tunable single-mode laser through movement of an intracavity optic, the present invention relies on ECDL longitudinal mode hops. This approach is viable because the cavity of the present invention is longer and the longitudinal mode spacing is smaller than in existing commercial designs. The present invention tailors the cavity length to the absorption feature of interest so that the ECDL mode spacing is sufficiently small in order to obtain adequate resolution of the absorption line shape. In order to implement the longer cavity lengths of our ECDL in a physically small package, an intracavity multiple pass configuration can be used. FIG. 6 shows an example of a planar multiple pass system comprising mirrors 21,21' located between the grating and the feedback mirror. An alternative placement is between the diode laser and the diffraction grating (not shown). Other types of multiple pass configurations (e.g., Herriott cells, White cells, Perry cells, etc.) may be employed in conjunction with the invention. Of course, the cavity can simply be made the appropriate length by physically spacing the laser diode, diffraction grating and feedback mirror as required although the laser will be physically larger.

Operation of the present invention as a high sensitivity trace gas sensor first involves coarse wavelength tuning to the nominal region of the target gaseous absorption feature by adjustment of the cavity feedback mirror. Then, fine adjustment can be made to the wavelength with temperature and injection current tuning. Finally, high frequency modulation is implemented by injection current modulation of the diode laser gain medium.

A commercial advantage of the present invention is that the low-dispersion ECDL can be applied to trace gas detection with sensitivity equal to single-mode diode lasers when set at a particular wavelength for long term measurement. Of course, the inherent broad wavelength tuning of the ECDL allows operating the same system on absorption features of several species. Thus, multiple species detection is possible. In addition, the design offers cost advantages due to the lack of a high performance AR coating on the diode laser, the available omission of PZT-driven optics, and the use of low dispersion gratings. The present design has superior sensitivity to presently available commercial ECDL designs. The invention is more rugged because moving parts are not essential (the cavity feed back mirror can be locked in place after alignment and coarse tuning).

The mechanism for wavelength modulation in the present invention introduces a concomitant amplitude modulation. Wavelength modulation through use of injection current modulation of DFB and Fabry-Perot lasers alone also induces amplitude modulation. This is not necessarily a problem when using wavelength modulation methods if the amplitude modulation is not efficiently coupled into the harmonic(s) used for detection. Furthermore, the addition of a balanced photoreceiver (New Focus, Inc. Model #2007 and #2017; U.S. Pat. No. 6,040,914; and D. B. Oh, et al., *Appl. Opt.* 34, 7002 (1995)) to the wavelength modulated ECDL output can discriminate against the amplitude modulation.

Although the invention has been described in detail with particular reference to these preferred embodiments, other embodiments can achieve the same results. Variations and modifications of the present invention will be obvious to those skilled in the art and it is intended to cover in the appended claims all such modifications and equivalents. The entire disclosures of all references, applications, patents, and publications cited above are hereby incorporated by reference.

What is claimed is:

1. An external cavity diode laser comprising:
    a Fabry-Perot diode laser light source tunable by injection current or temperature;
    an intracavity optical element collimating light from said source;
    a feedback mirror; and
    a diffraction grating receiving light from said optical element, diffracting received light to said mirror in a non-zero order, receiving reflected light from said mirror, and directing reflected light back towards said optical element and Fabry-Perot diode laser to complete the external cavity, said diffraction grating additionally directing a portion of said received light from said optical element toward a target; and
    wherein output wavelength of said external cavity diode laser is discretely tunable in that said Fabry-Perot diode laser has a characteristic selected from a group consisting of lacking an anti-reflection coating and comprising an anti-reflection coating that does not interfere with residual diode laser Fabry-Perot modes providing sufficient differential gain when tuned by injection current or temperature to allow single frequency operation and single longitudinal mode-hopping within a pass band of said grating.

2. The external cavity laser of claim 1 additionally comprising a multiple pass optical configuration to provide a sufficiently narrow longitudinal mode spacing.

3. The external cavity laser of claim 1 wherein said mirror reflects a first order diffraction from said grating.

4. The external cavity laser of claim 3 wherein said mirror provides wavelength selectivity by its orthonormal angular position with respect to said diffraction grating, said angular position coupled with a wavelength diffraction of said diffraction grating determining a particular wavelength of light for feedback into said external cavity.

5. The external cavity laser of claim 1 wherein said grating provides a sufficiently low dispersion to allow wavelength tuning by longitudinal mode hopping within a grating pass band through interaction of the grating pass band with diode laser Fabry-Perot modes where the interaction simultaneously ensures successive single longitudinal mode operation.

6. The external cavity laser of claim 1 wherein wavelength of the light directed toward the target is tuned by varying a diode gain element injection current of said diode laser source.

7. The external cavity laser of claim 1 wherein wavelength of the light directed toward the target is tuned by varying the temperature of said diode laser source.

8. The external cavity laser of claim 1 wherein wavelength of the light directed toward the target is wavelength modulated by injection current modulation.

9. The external cavity laser of claim 1 wherein wavelength of the light directed toward the target is wavelength modulated by diode laser temperature modulation.

10. A method of generating laser light, the method comprising the steps of:
    generating light from a Fabry-Perot diode laser source tunable by injection current or temperature;
    collimating light from the source with an intracavity optical element;
    reflecting light via a feedback mirror; and
    employing a diffraction grating to receive light from the optical element, diffract received light to the mirror in a non-zero order, receive reflected light from the mirror, and direct reflected light back towards the optical element and Fabry-Perot diode laser to complete an external cavity, the diffraction grating additionally directing a portion of the received light from the optical element toward a target; and
    wherein output wavelength of the generated laser light is discretely tunable in that in the generating step the Fabry-Perot diode laser has a characteristic selected from a group consisting of lacking an anti-reflection coating and comprising an anti-reflection coating that does not interfere with residual diode laser Fabry-Perot modes providing sufficient differential gain when tuned by injection current or temperature to allow single frequency operation and single longitudinal mode-hopping within a pass band of the grating.

11. The method of claim 10 additionally comprising the step of employing a multiple pass optical configuration to provide a sufficiently narrow longitudinal mode spacing.

12. The method of claim 10 wherein in the reflecting step the mirror reflects a first order diffraction from the grating.

13. The method of claim 12 wherein in the reflecting step the mirror provide wavelength selectivity by its orthonormal angular position with respect to the diffraction grating, the angular position coupled with a wavelength diffraction of the diffraction grating determining a particular wavelength of light for feedback into the external cavity.

14. The method of claim 10 wherein in the employing step the grating provides a sufficiently low dispersion to allow wavelength tuning by longitudinal mode hopping within a grating pass band through interaction of the grating pass band with diode laser Fabry-Perot modes where the interaction simultaneously ensures successive single longitudinal mode operation.

15. The method of claim 10 additionally comprising the step of tuning wavelength of the light directed toward the target by varying a diode gain element injection current of the diode laser source.

16. The method of claim 10 additionally comprising the step of tuning wavelength of the light directed toward the target by varying the temperature of the diode laser source.

17. The method of claim 10 additionally comprising the step of modulating wavelength of the light directed toward the target by injection current modulation.

18. The method of claim 10 additionally comprising the step of modulating wavelength of the light directed toward the target by diode laser temperature modulation.

19. The method of claim 10 wherein in the employing step the target comprises means for injecting light into an optical fiber.

20. An optical system comprising an external cavity diode laser according to claim 1 wherein said target comprises means for injecting light into an optical fiber.

21. The optical system of claim 20 wherein said system comprises means for providing Fabry-Perot modes spaced in frequency by a spacing selected from the group consisting of dense wavelength division multiplexing channel frequency spacings and integer multiples and fractions thereof.

22. The external cavity laser of claim 1 wherein said system comprises means for providing Fabry-Perot modes spaced in frequency by a spacing selected from the group consisting of dense wavelength division multiplexing channel frequency spacings and integer multiples and fractions thereof.

23. The method of claim 10 additionally comprising the step of providing Fabry-Perot modes spaced in frequency by a spacing selected from the group consisting of dense wavelength division multiplexing channel frequency spacings and integer multiples and fractions thereof.

24. The method of claim 19 additionally comprising the step of providing Fabry-Perot modes spaced in frequency by a spacing selected from the group consisting of dense wavelength division multiplexing channel frequency spacings and integer multiples and fractions thereof.

* * * * *

UNITED STATES PATENT AND TRADEMARK OFFICE
CERTIFICATE OF CORRECTION

PATENT NO. : 6,683,895 B2
DATED : January 27, 2004
INVENTOR(S) : Jeffrey S. Pilgrim et al.

It is certified that error appears in the above-identified patent and that said Letters Patent is hereby corrected as shown below:

Column 1,
Lines 13-18, should read -- This invention was made with Government support under Contract NAS3-00054 awarded by NASA. The Government has certain rights in this invention. --.

Signed and Sealed this

Twenty-fifth Day of October, 2005

JON W. DUDAS
*Director of the United States Patent and Trademark Office*